United States Patent
Kondo et al.

(10) Patent No.: US 11,927,655 B2
(45) Date of Patent: Mar. 12, 2024

(54) MAGNETIC RESONANCE IMAGING APPARATUS

(71) Applicant: CANON MEDICAL SYSTEMS CORPORATION, Tochigi (JP)

(72) Inventors: Hiroki Kondo, Nasushiobara (JP); Masaaki Umeda, Sakura (JP); Masanori Ozaki, Hachioji (JP)

(73) Assignee: CANON MEDICAL SYSTEMS CORPORATION, Tochigi (JP)

(*) Notice: Subject to any disclaimer, the term of this patent is extended or adjusted under 35 U.S.C. 154(b) by 0 days.

(21) Appl. No.: 17/814,950

(22) Filed: Jul. 26, 2022

(65) Prior Publication Data
US 2023/0059453 A1  Feb. 23, 2023

(30) Foreign Application Priority Data
Aug. 17, 2021 (JP) ................. 2021-132489

(51) Int. Cl.
*G01V 3/00* (2006.01)
*G01R 33/483* (2006.01)
*G01R 33/56* (2006.01)

(52) U.S. Cl.
CPC ..... *G01R 33/4835* (2013.01); *G01R 33/5608* (2013.01)

(58) Field of Classification Search
CPC .............. G01R 33/3415; G01R 33/543; G01R 33/5659; G01R 33/36; A61B 5/055
USPC ....................................................... 324/309
See application file for complete search history.

(56) References Cited

U.S. PATENT DOCUMENTS

| | | | |
|---|---|---|---|
| 6,288,543 B1* | 9/2001 | Listerud ............ | G01R 33/4835 324/309 |
| 7,233,818 B1 | 6/2007 | Aletras et al. | |
| 7,706,857 B2 | 4/2010 | Aletras et al. | |
| 9,696,400 B2* | 7/2017 | Grodzki ............ | G01R 33/4833 |
| 2007/0219442 A1 | 9/2007 | Aletras et al. | |
| 2009/0179641 A1* | 7/2009 | Matsuda ............ | G01R 33/4835 324/309 |
| 2013/0249548 A1* | 9/2013 | Stemmer ............ | G01R 33/543 324/309 |

(Continued)

FOREIGN PATENT DOCUMENTS

| | | |
|---|---|---|
| JP | 2001-061812 A | 3/2001 |
| JP | 2003-506174 A | 2/2003 |
| JP | 2014-033791 A | 2/2014 |

(Continued)

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A magnetic resonance imaging apparatus according to an embodiment includes processing circuitry. The processing circuitry sets a pulse sequence to collect plural echo signals by application of a refocusing pulse more than once after application of an excitation pulse once, and collects data on plural slices that are parallel to each other by executing the pulse sequence more than once. The processing circuitry sets the pulse sequence such that a slice thickness for the refocusing pulse becomes larger than a slice thickness for the excitation pulse, and collects the data on the plural slices by executing the pulse sequence without consecutively collecting data on adjacent ones of the plural slices.

11 Claims, 6 Drawing Sheets

(56) References Cited

U.S. PATENT DOCUMENTS

2013/0320976 A1* 12/2013 Krieg ................... G01R 33/44
                                                        324/309
2014/0270453 A1*  9/2014 Guo .................... A61B 5/7271
                                                        382/131

FOREIGN PATENT DOCUMENTS

JP        2021-058545 A      4/2021
WO    WO-2013082207 A1 *    6/2013    ............. A61B 5/055

* cited by examiner

MAGNETIC RESONANCE IMAGING APPARATUS

CROSS-REFERENCE TO RELATED APPLICATIONS

This application is based upon and claims the benefit of priority from Japanese Patent Application No. 2021-132489, filed on Aug. 17, 2021; the entire contents of which are incorporated herein by reference.

FIELD

Embodiments disclosed in the specification and drawings are related to magnetic resonance imaging apparatuses.

BACKGROUND

Conventionally, in an examination of the cervical vertebra of a subject using a magnetic resonance imaging (MRI) apparatus, typically, images of plural slices set in parallel along the cervical vertebra are captured using a fast spin echo (FSE) method. In this case, contrast for the cerebrospinal fluid (CSF) in the captured images is important.

DETAILED DESCRIPTION

An MRI apparatus according to an embodiment includes a setting unit and a collecting unit. The setting unit sets a pulse sequence to collect plural echo signals by application of a refocusing pulse more than once after application of an excitation pulse once. The collecting unit collects data on plural slices that are parallel to each other by executing the pulse sequence more than once. The setting unit sets the pulse sequence such that a slice thickness for the refocusing pulse becomes larger than a slice thickness for the excitation pulse. The collecting unit collects the data on the slices by executing the pulse sequence without consecutively collecting data on adjacent ones of the plural slices.

An embodiment of an MRI apparatus according to the present application will hereinafter be described in detail while reference is made to the drawings.

Embodiment

Figure 1:
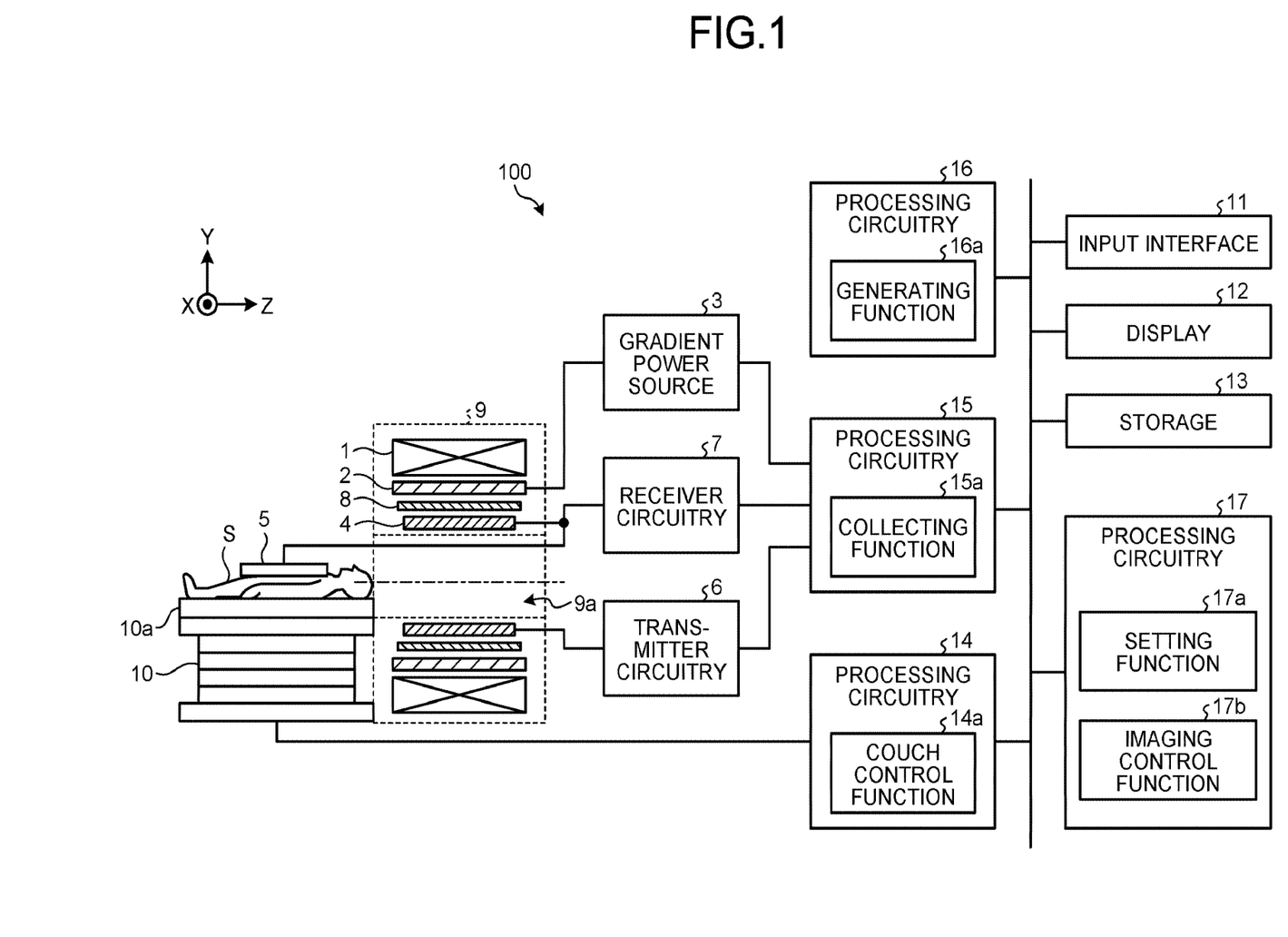
FIG. 1 is a diagram illustrating an example of a configuration of an MRI apparatus according to an embodiment.

FIG. 1 is a diagram illustrating an example of a configuration of an MRI apparatus according to an embodiment.

For example, as illustrated in FIG. 1, an MRI apparatus 100 includes a static magnetic field magnet 1, a gradient coil 2, a gradient power source 3, a whole body radio frequency (RF) coil 4, a local RF coil 5, transmitter circuitry 6, receiver circuitry 7, an RF shield 8, a gantry 9, a couch 10, an input interface 11, a display 12, a storage 13, and processing circuitries 14 to 17.

The static magnetic field magnet 1 generates a static magnetic field in an imaging space where a subject S is placed. Specifically, the static magnetic field magnet 1 is formed in an approximately cylindrical shape (which may be a shape having an oval cross section orthogonal to the central axis of the static magnetic field magnet 1) that is hollow. The static magnetic field magnet 1 generates a static magnetic field in the imaging space formed inside the static magnetic field magnet 1. For example, the static magnetic field magnet 1 is a superconducting magnet or a permanent magnet. The superconducting magnet referred to herein includes, for example: a container filled with a coolant, such as liquid helium; and a superconducting coil immersed in the container.

The gradient coil 2 is placed inside the static magnetic field magnet 1 and generates gradient magnetic fields in the imaging space where the subject S is placed. Specifically, the gradient coil 2 is formed in an approximately cylindrical shape (which may be a shape having an oval cross section orthogonal to the central axis) and has an X coil, a Y coil, and a Z coil respectively corresponding to an X axis, a Y axis, and a Z axis that are orthogonal to one another. On the basis of electric current supplied from the gradient power source 3, the X coil, Y coil, and Z coil generate, in the imaging space, gradient magnetic fields that linearly change respectively along the X axis, Y axis, and Z axis. The Z axis is set along a magnetic flux of the static magnetic field generated by the static magnetic field magnet 1. The X axis is set along a horizontal direction orthogonal to the Z axis and the Y axis is set along a vertical direction orthogonal to the Z axis. The X axis, Y axis, and Z axis form a device coordinate system specific to the MRI apparatus 100.

The gradient power source 3 generates gradient magnetic fields in the imaging space by supplying electric current to the gradient coil 2. Specifically, by supplying electric current individually to the X coil, Y coil, and Z coil of the gradient coil 2, the gradient power source 3 generates, in the imaging space, gradient magnetic fields that linearly change respectively along a readout direction, a phase encoding direction, and a slice direction that are orthogonal to one another. An axis along the readout direction, an axis along the phase encoding direction, and an axis along the slice direction form a logical coordinate system for determination of a slice region or a volume region to be subjected to imaging.

Specifically, by being superimposed on the static magnetic field generated by the static magnetic field magnet 1, the gradient magnetic fields that are respectively along the readout direction, phase encoding direction, and slice direction provide spatial positional information to a nuclear magnetic resonance (NMR) signal generated from the subject S. More specifically, the gradient magnetic field in the readout direction provides positional information on the readout direction to the NMR signal by changing the frequency of the NMR signal according to a position along the readout direction. The gradient magnetic field in the phase encoding direction provides positional information on the phase encoding direction to the NMR signal by changing the phase of the NMR signal according to a position along the phase encoding direction. The gradient magnetic field in the slice direction provides positional information on the slice direction to the NMR signal. For example, in a case where the imaging region is a slice region (2D imaging), the gradient magnetic field in the slice direction is used for determination of the direction, thickness, and number of slices of the slice region. In a case where the imaging region is a volume region (3D imaging), the gradient magnetic field in the slice direction is used for change of the phase of the NMR signal according to a position along the slice direction.

The whole body RF coil 4 is placed inside the gradient coil 2, applies an RF pulse (for example, an excitation pulse) to the subject S placed in the imaging space, and receives an NMR signal (for example, an echo signal) generated from the subject S by influence of the RF pulse. Specifically, the whole body RF coil 4 is formed in an approximately cylindrical shape (which may be a shape having an oval cross section orthogonal to the central axis) that is hollow and applies, on the basis of an RF pulse signal supplied from the transmitter circuitry 6, an RF pulse to the subject S placed in the imaging space positioned inside the whole body RF coil 4. The whole body RF coil 4 receives an NMR signal generated from the subject S by influence of the RF pulse and outputs the received NMR signal to the receiver circuitry 7. For example, the whole body RF coil 4 is a birdcage coil or a transverse electromagnetic (TEM) coil.

The local RF coil 5 is placed near the subject S at the time of imaging and receives an NMR signal generated from the subject S. Specifically, the local RF coil 5 is prepared for each part of the body of the subject S, is placed near a part to be subjected to imaging when imaging of the subject S is performed, receives an NMR signal generated from the subject S by influence of an RF pulse applied by the whole body RF coil 4, and outputs the received NMR signal to the receiver circuitry 7. For example, the local RF coil 5 is a surface coil or a phased array coil formed of a combination of plural surface coils serving as coil elements. The local RF coil 5 may further have a transmitting function of applying an RF pulse to a subject.

The transmitter circuitry 6 outputs an RF pulse signal corresponding to a resonance frequency (Larmor frequency) specific to a target atomic nucleus placed in the static magnetic field, to the whole body RF coil 4 or the local RF coil 5. Specifically, the transmitter circuitry 6 has a pulse generator, an RF generator, a modulator, and an amplifier. The pulse generator generates a waveform of an RF pulse signal. The RF generator generates an RF signal of the resonance frequency. The modulator generates an RF pulse signal by modulating, with the waveform generated by the pulse generator, the amplitude of the RF signal generated by the RF generator. The amplifier amplifies the RF pulse signal generated by the modulator and outputs the amplified RF pulse signal to the whole body RF coil 4 or the local RF coil 5.

The receiver circuitry 7 generates NMR data on the basis of an NMR signal output from the whole body RF coil 4 or local RF coil 5, and outputs the generated NMR data to the processing circuitry 15. Specifically, the receiver circuitry 7 includes a selector, a preamplifier, a phase detector, and an analog/digital (A/D) converter. The selector selectively inputs the NMR signal output from the whole body RF coil 4 or local RF coil 5. The preamplifier amplifies the NMR signal output from the selector. The phase detector detects the phase of the NMR signal output from the preamplifier. The A/D converter generates NMR data by converting an analog signal output from the phase detector into a digital signal and outputs the generated NMR data to the processing circuitry 15. Not necessarily all of the processing described herein as being performed by the receiver circuitry 7 needs to be performed at the receiver circuitry 7, and part of the processing (for example, the processing by the A/D converter) may be performed at the whole body RF coil 4 or the local RF coil 5.

The RF shield 8 is placed between the gradient coil 2 and the whole body RF coil 4 and shields the gradient coil 2 from RF pulses generated by the whole body RF coil 4. Specifically, the RF shield 8 is formed in an approximately cylindrical shape (which may be a shape having an oval cross section orthogonal to the central axis of the cylinder) that is hollow and is placed to cover the outer peripheral surface of the whole body RF coil 4, in a space inside the gradient coil 2.

The gantry 9 has a hollow bore 9a formed in an approximately cylindrical shape (which may be a shape having an oval cross section orthogonal to the central axis) and houses the static magnetic field magnet 1, the gradient coil 2, the whole body RF coil 4, and the RF shield 8. Specifically, the gantry 9 houses the whole body RF coil 4 placed outside the bore 9a, the RF shield 8 placed outside the whole body RF coil 4, the gradient coil 2 placed outside the RF shield 8, and the static magnetic field magnet 1 placed outside the gradient coil 2. The space in the bore 9a of the gantry 9 serves as the imaging space where the subject S is placed at the time of imaging.

The couch 10 includes a couchtop 10a where the subject S is placed and the couch 10 moves the couchtop 10a having the subject S placed thereon into the imaging space when imaging of the subject S is performed. For example, the couch 10 is installed such that a longitudinal direction of the couchtop 10a becomes parallel to the central axis of the static magnetic field magnet 1.

The embodiment is not limited to the example described herein, the example being that of the case where the MRI apparatus 100 has a so-called tunnel structure where the static magnetic field magnet 1, the gradient coil 2, and the whole body RF coil 4 are each formed in an approximately cylindrical shape. For example, the MRI apparatus 100 may have a so-called open structure where a pair of static magnetic field magnets, a pair of gradient coils, and a pair of RF coils are each placed oppositely with the imaging space interposed therebetween, the imaging space being where the subject S is placed. In this open structure, the space between the pair of static magnetic field magnets, the pair of gradient coils, and the pair of RF coils corresponds to the bore of the tunnel structure.

The input interface 11 receives input operations for various instructions and various types of information, from an operator. Specifically, the input interface 11 is connected to the processing circuitry 17, converts an input operation received from the operator, into an electric signal, and outputs the converted electric signal to the processing circuitry 17. For example, the input interface 11 is implemented by any of: a trackball; switch buttons; a mouse; a keyboard; a touch pad through which an input operation is performed by contact with an operating surface; a touch screen having a display screen and a touch pad integrated with each other; a non-contact input circuit using an optical sensor; and a voice input circuit that are for setting of imaging conditions and a region of interest (ROI). According to this specification, the input interface 11 is not necessarily an input interface having physical operating parts, such as a mouse and a keyboard. For example, examples of the input interface 11 also include processing circuitry that receives an electric signal corresponding to an input operation from an external input device provided separately from the MRI apparatus 100 and outputs this electric signal to control circuitry.

The display 12 displays various types of information. Specifically, the display 12 is connected to the processing circuitry 17, converts data on various types of information transmitted from the processing circuitry 17, into electric signals for display, and outputs the electric signals. For example, the display 12 is implemented by a liquid crystal monitor, a CRT monitor, or a touch panel.

The storage 13 stores therein various data. Specifically, the storage 13 is connected to the processing circuitries 14 to 17, and stores therein various data input and output by the processing circuitries 14 to 17. For example, the storage 13 is implemented by: a semiconductor memory element, such as a random access memory (RAM) or a flash memory; a hard disk; or an optical disk.

The processing circuitry 14 has a couch control function 14a. The couch control function 14a controls operation of the couch 10 by outputting an electric signal for control, to the couch 10. For example, the couch control function 14a receives from an operator, via the input interface 11, an instruction to move the couchtop 10a in the longitudinal direction, up-down direction, or left-right direction and operates a moving mechanism of the couchtop 10a of the couch 10 to move the couchtop 10a according to the received instruction.

The processing circuitry 15 has a collecting function 15a. By executing various pulse sequences, the collecting function 15a collects k-space data. Specifically, the collecting function 15a executes various pulse sequences by driving the gradient power source 3, the transmitter circuitry 6, and the receiver circuitry 7 according to sequence execution data output by an imaging control function 17b of the processing circuitry 17. The sequence execution data are data representing pulse sequences, and are information prescribing, for example: the timing of supply of electric current by the gradient power source 3 to the gradient coil 2 and the intensity of the supplied electric current; the timing of supply of an RF pulse signal by the transmitter circuitry 6 to the whole body RF coil 4 and the intensity of the supplied RF pulse signal; and the timing of sampling of an NMR signal by the receiver circuitry 7. The collecting function 15a receives NMR data output as a result of execution of the pulse sequences, from the receiver circuitry 7, and stores the received NMR data into the storage 13. The NMR data stored in the storage 13 are stored as k-space data representing a two-dimensional or three-dimensional k-space by being provided, respectively by the gradient magnetic fields described above, with information on positions along the readout direction, the phase encoding direction, and the slice direction.

The processing circuitry 16 has a generating function 16a. The generating function 16a generates an image from the k-space data collected by the collecting function 15a of the processing circuitry 15. Specifically, the generating function 16a generates a two-dimensional or three-dimensional image by reading, from the storage 13, the k-space data collected by the collecting function 15a of the processing circuitry 15 and performing reconstruction processing, such as Fourier transform, on the read k-space data. The generating function 16a then stores the generated image into the storage 13.

The processing circuitry 17 has a setting function 17a and the imaging control function 17b. The setting function 17a receives input of imaging conditions from an operator via the input interface 11 and sets, on the basis of the input imaging conditions, pulse sequences for collecting k-space data on the subject S. The imaging control function 17b causes the collecting function 15a of the processing circuitry 15 to execute the pulse sequences by generating sequence execution data representing the pulse sequences set by the setting function 17a and outputting the generated sequence execution data to the processing circuitry 15. Furthermore, by controlling the processing circuitry 16, the imaging control function 17b causes an image to be reconstructed from the k-space data collected by the processing circuitry 15. In addition, according to a request from an operator, the imaging control function 17b reads an image stored in the storage 13 and displays the read image on the display 12.

An example of the configuration of the MRI apparatus 100 according to the embodiment has been described above. The MRI apparatus 100 according to the embodiment and having the above described configuration has a function of imaging plural slices that are parallel to each other by using a fast spin echo (FSE) method.

Specifically, the setting function 17a of the processing circuitry 17 sets a pulse sequence for an FSE method to collect plural echo signals by application of a refocusing pulse more than once after application of an excitation pulse once. The setting function 17a is an example of a setting unit.

Figure 2:
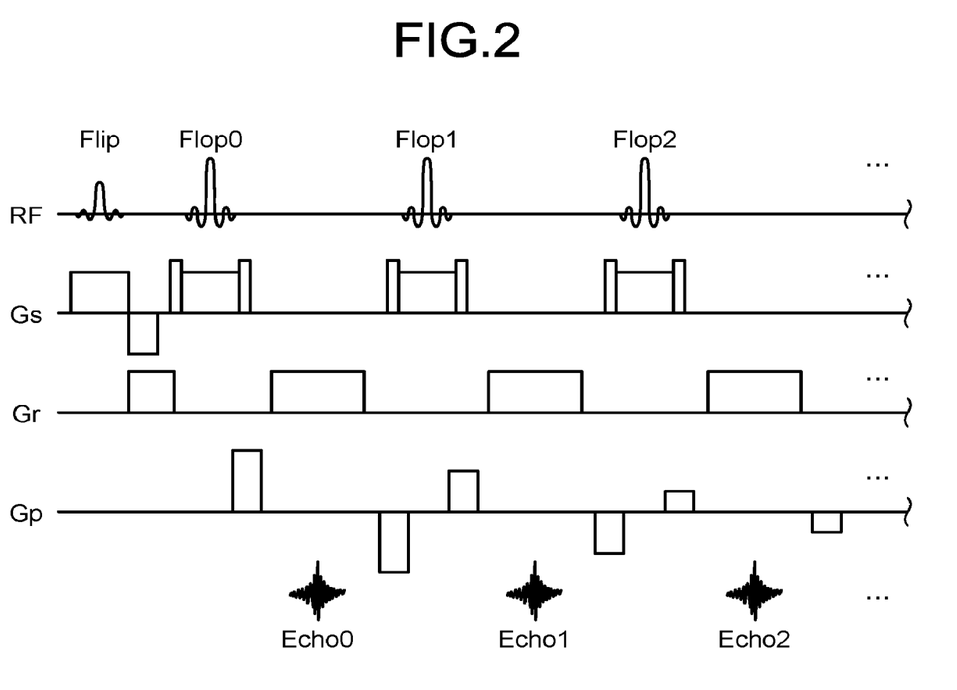
FIG. 2 is an example of a pulse sequence for an FSE method, the pulse sequence being set by a setting function according to the embodiment.

FIG. 2 is an example of a pulse sequence for an FSE method, the pulse sequence being set by the setting function 17a according to the embodiment.

In FIG. 2, "RF" indicates the timing of application of RF pulses. For "Gs", the horizontal axis represents the timing and time periods of application of a slice gradient magnetic field and the vertical axis represents the intensity of the slice gradient magnetic field. As to "Gr", the horizontal axis represents the timing and time periods of application of a readout gradient magnetic field and the vertical axis represents the intensity of the readout gradient magnetic field. For "Gp", the horizontal axis represents the timing and time periods of application of a phase encoding gradient magnetic field and the vertical axis represents the intensity of the phase encoding gradient magnetic field.

For example, as illustrated in FIG. 2, in the pulse sequence for the FSE method, after an excitation pulse (Flip) is applied, plural refocusing pulses (Flop0, Flop1, Flop2 . . . ) are applied consecutively. The excitation pulse is a 90° pulse and the refocusing pulses are 180° pulses, for example. By this consecutive application of plural refocusing pulses, an echo signal (Echo0, Echo1, Echo2 . . . ) is generated every time one of the refocusing pulses is applied.

The slice gradient magnetic field is applied at the times when the excitation pulse and the refocusing pulses are applied. Furthermore, immediately after each of the refocusing pulses is applied, the phase encoding gradient magnetic field is applied with the intensity of the phase encoding gradient magnetic field being changed stepwise for that refocusing pulse. Furthermore, at the time when each of the echo signals is generated, the readout gradient magnetic field is applied. Positions along the readout direction, phase encoding direction, and slice direction are thereby provided to the echo signals generated by the respective refocusing pulses and k-space data are thereby collected.

The collecting function 15a of the processing circuitry 15 executes, more than once, the pulse sequence for the FSE method set by the setting function 17a and thereby collects data on plural slices that are parallel to each other. The collecting function 15a is an example of a collecting unit.

For example, in an examination of the cervical vertebra of a subject using an MRI apparatus, typically, T1-weighted images or T2-weighted images of plural slices set in parallel along the cervical vertebra are captured using a FSE method. In this case, contrast for the CSF in the captured images is important.

Figure 3:
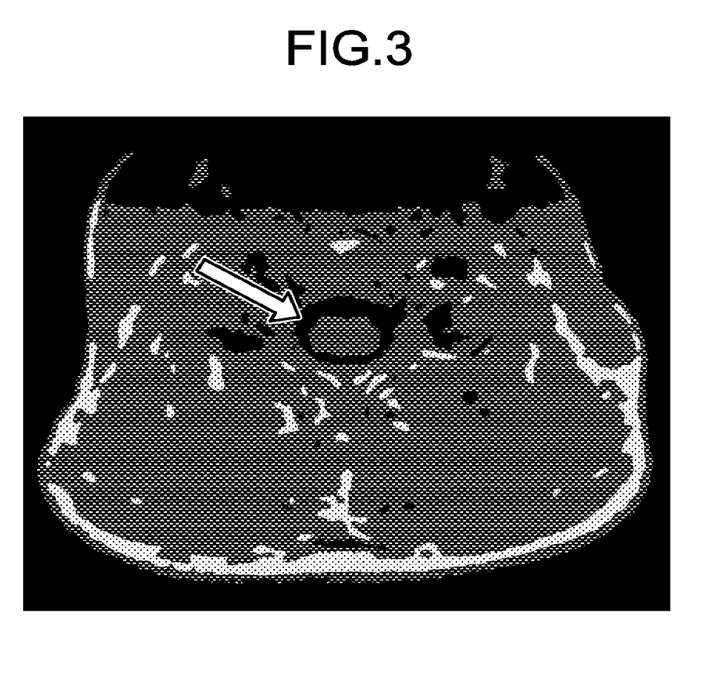
FIG. 3 is a diagram illustrating an example of a T1-weighted image captured in an examination of a cervical vertebra.
Figure 4:
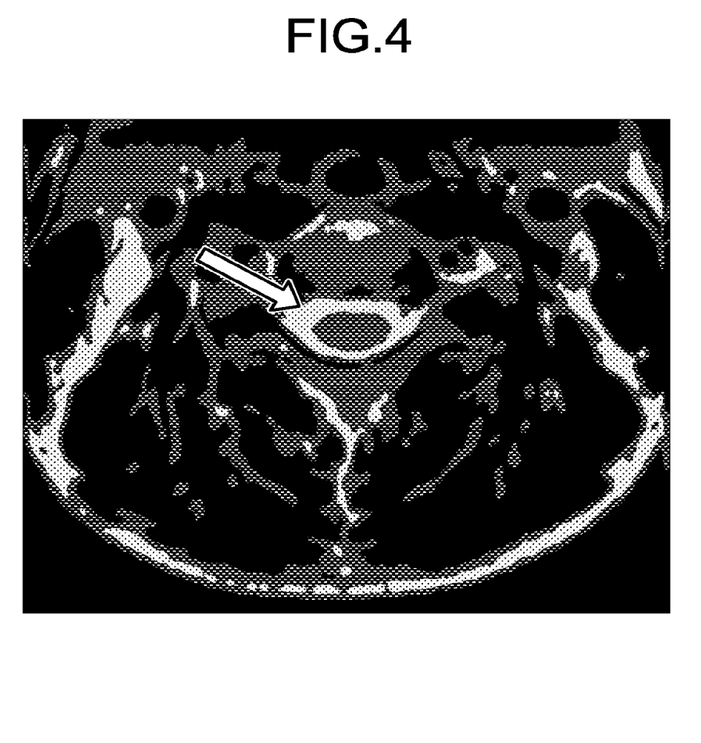
FIG. 4 is a diagram illustrating an example of a T2-weighted image captured in an examination of a cervical vertebra.

FIG. 3 is a diagram illustrating an example of a T1-weighted image captured in an examination of a cervical vertebra. FIG. 4 is a diagram illustrating an example of a T2-weighted image captured in an examination of a cervical vertebra.

For example, as illustrated in FIG. 3, luminance at the CSF in the T1-weighted image captured in the examination of the cervical vertebra is desirably low (with many flow voids). Furthermore, as illustrated in FIG. 4, luminance at the CSF in the T2-weighted image captured in the examination of the cervical vertebra is desirably high (with less flow voids).

However, sufficient contrast for the CSF may sometimes be not obtained in T1-weighted images and T2-weighted images captured using an FSE method. Specifically, sufficiently low luminance values may be not obtained for the CSF in T1-weighted images and sufficiently high luminance values may be not obtained for the CSF in T2-weighted images.

In view of the above, the MRI apparatus 100 according to the embodiment is configured to be able to improve the contrast for the CSF in images.

Specifically, the setting function 17a according to the embodiment sets a pulse sequence for an FSE method such that a slice thickness for a refocusing pulse becomes larger than a slice thickness for the excitation pulse.

For example, the setting function 17a sets the slice thickness for a refocusing pulse larger than the slice thickness of the excitation pulse by adjusting the intensity of a gradient magnetic field in the slice direction, the gradient magnetic field being applied together with the refocusing pulse.

Under imaging conditions for acquisition of a T1-weighted image, the saturation effect is thereby increased and the luminance at the CSF in the T1-weighted image is thereby able to be decreased, because the repetition time (TR) for the T1 value at the CSF is sufficiently short and longitudinal magnetization of the CSF component excited in a slice thus flows into the adjacent slice and excitation is thus caused without sufficient recovery from the longitudinal magnetization between the slices. Furthermore, under imaging conditions for acquisition of a T2-weighted image, flow voids for the CSF in the T2-weighted image are able to be reduced, because refocusing pulses are applied, over wide ranges, also to the CSF component flowing out from a slice while the refocusing pulses are being applied consecutively after the excitation pulse is applied.

In a case where the slice thickness for a refocusing pulse is set larger than the slice thickness for the excitation pulse as described above, a wider range is selectively excited by the refocusing pulse and interference is thus considered to occur easily between adjacent slices.

Therefore, the collecting function 15a according to the embodiment collects data on plural slices by executing a pulse sequence for an FSE method without consecutively collecting data on adjacent ones of the plural slices.

For example, the collecting function 15a divides plural slices into plural groups such that adjacent ones of the plural slices are included in groups different from each other and collects, in order, data on the slices included in each of these groups, group by group.

Furthermore, for example, the collecting function 15a collects data on the slices included in each of the groups by repeating, group by group: selecting a slice every two or more slices in the direction the slices are sequenced for each of the groups; and collecting, in order, data on the selected slices.

Figure 5:
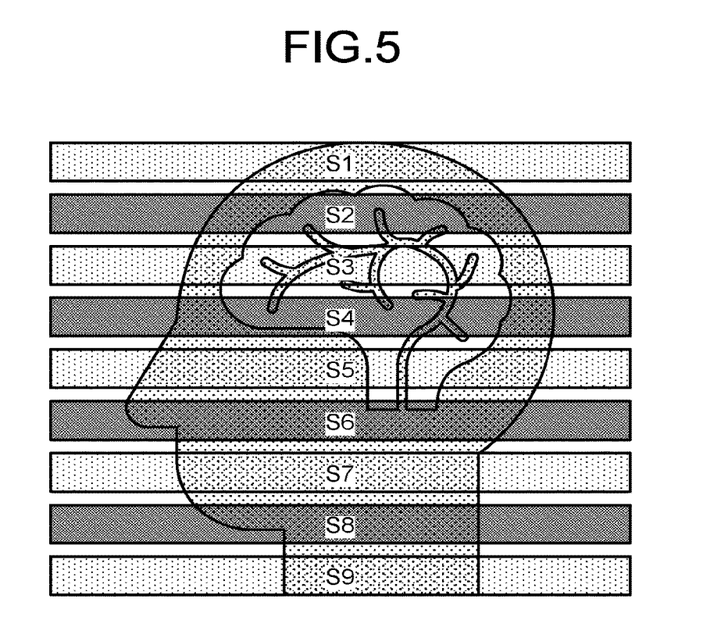
FIG. 5 is a diagram illustrating an example of data collection implemented by a collecting function according to the embodiment.
Figure 6A:
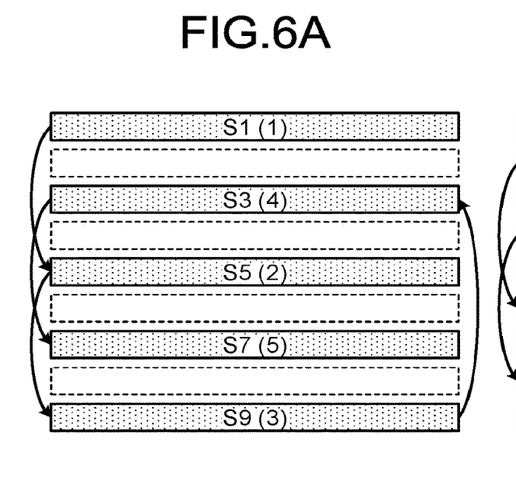
FIGS. 6A and 6B are diagrams illustrating the example of the data collection implemented by the collecting function according to the embodiment.
Figure 6B:
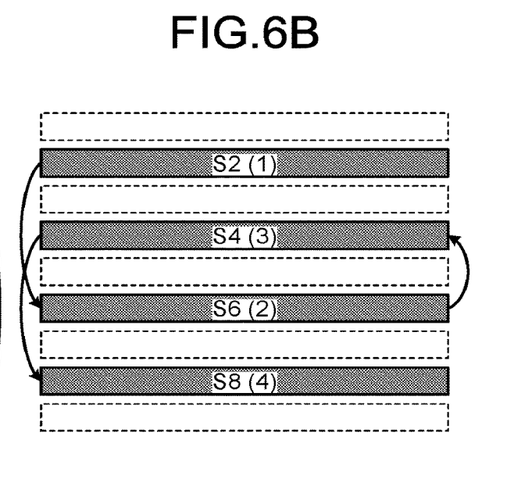

FIG. 5 and FIGS. 6A and 6B are diagrams illustrating an example of data collection implemented by the collecting function 15a according to the embodiment.

For example, as illustrated in FIG. 5, in a case where an examination of the cervical vertebra of a subject is performed, the collecting function 15a collects data on nine slices S1 to S9 set to be parallel to each other along the craniocaudal direction for the head of the subject.

In this case, for example, according to an imaging division number (also called a coverage) specified by an operator, the collecting function 15a divides the nine slices S1 to S9 into plural groups such that adjacent ones of the slices are included in groups different from each other.

For example, as illustrated in FIGS. 6A and 6B, the collecting function 15a divides the nine slices S1 to S9 into two groups in a case where the imaging division number specified by the operator is "2". Specifically, the collecting function 15a divides the nine slices S1 to S9 into a first group (FIG. 6A) of the slices S1, S3, S5, S7, and S9 by selection of every other slice and a second group (FIG. 6B) of the slices S2, S4, S6, and S8 by selection of every other slice.

For example, as illustrated by numbers in parentheses in FIGS. 6A and 6B, the collecting function 15a collects data on the slices included in each of these groups by repeating, group by group: selecting every other slice in the direction the slices are sequenced; and collecting, in order, data on the selected slices. Specifically, the collecting function 15a collects data on the slices included in the first group in the order, the slices S1, S5, S9, S3, and S7, and thereafter collects data on the slices included in the second group in the order, the slices S2, S6, S4, and S8.

Dividing plural slices into groups each including every other slice such that adjacent ones of the slices are included in groups different from each other and collecting data on the slices, in order, group by group, enable: increase in distances between slices collected consecutively; and increase in time intervals at which data on the adjacent ones of the slices are collected. Furthermore, repeating, group by group, selection of every other slice in the direction the slices are sequenced and collection, in order, of data on the selected slices enables further increase in the intervals between the consecutively collected slices. Interference that occurs between adjacent slices is thereby reduced even in a case where the slice thickness for a refocusing pulse is set larger than the slice thickness for the excitation pulse.

In this case, the setting function 17a sets the slice thickness for the refocusing pulse according to a slice interval between plural slices, for example.

For example, the setting function 17a sets the slice thickness of the refocusing pulse according to a slice interval between plural slices, the slice interval being specified by an operator.

Figure 7A:
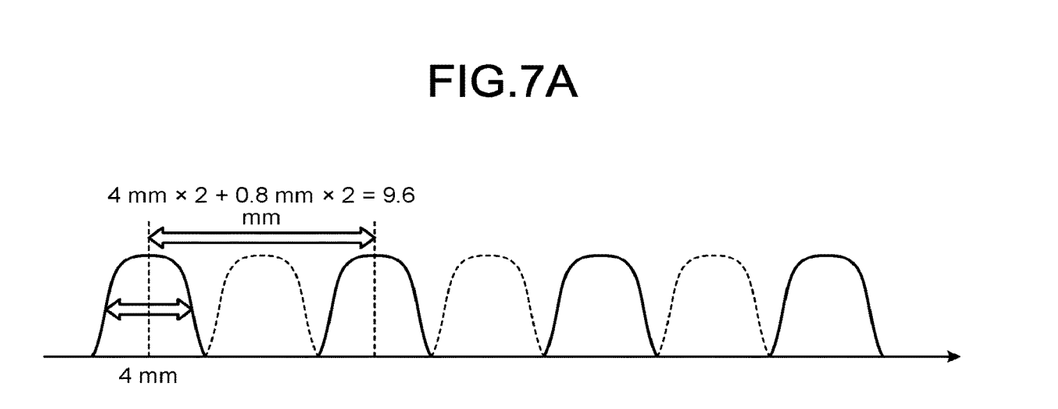
FIGS. 7A and 7B are diagrams illustrating an example of setting of a slice thickness for a refocusing pulse, the setting being implemented by the setting function according to the embodiment.
Figure 7B:
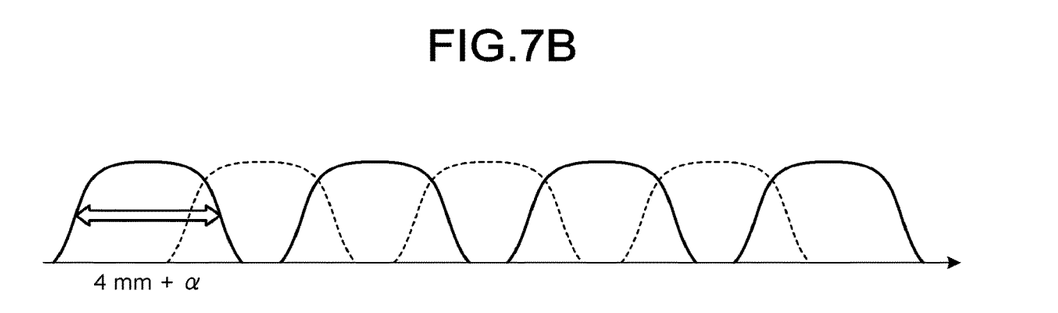

FIGS. 7A and 7B are diagrams illustrating an example of setting of a slice thickness of a refocusing pulse, the setting being implemented by the setting function 17a according to the embodiment.

For example, it is assumed herein that a slice interval specified by an operator is "0.8 mm" and the slice thickness is "4 mm".

In this case, in a typical FSE method, as illustrated in FIG. 7A, for example, the slice thicknesses of an excitation pulse and a refocusing pulse are each set at 4 mm. Furthermore, in a case where plural slices are divided into groups including every other slice of the plural slices and data are collected like the example illustrated in FIGS. 6A and 6B, the slice interval between refocusing pulses is set at 4 mm×2+0.8 mm×2=9.6 mm.

In contrast, in this embodiment, the setting function 17a sets the slice thickness for the excitation pulse at 4 mm, but sets the slice thickness for a refocusing pulse at 4 mm+a that is larger than 4 mm, as illustrated in FIG. 7B. Similarly to the example in FIG. 7A, the setting function 17a sets the slice interval between refocusing pulses and then sets the value of a according to that slice interval. For example, the setting function 17a sets the value of a at a value resulting from multiplication of the slice interval between the refocusing pulses by a predetermined rate. A value at which the magnitude of the interference caused between slices for the refocusing pulses stays within a permissible range is set as the value of a.

Processing functions included in the processing circuitries 14 to 17 have been described above, and the processing circuitries 14 to 17 are implemented by processors, for example. In this case, the processing functions included in the processing circuitries 14 to 17 are stored in the storage 13 in the form of programs that are able to be executed by a computer, for example. The processing circuitries 14 to 17 respectively implement their processing functions corresponding to these programs by reading and executing the programs from the storage 13. In other words, the processing circuitries 14 to 17 that have read the programs respectively have the functions illustrated in the processing circuitries 14 to 17 in FIG. 1.

Figure 8:
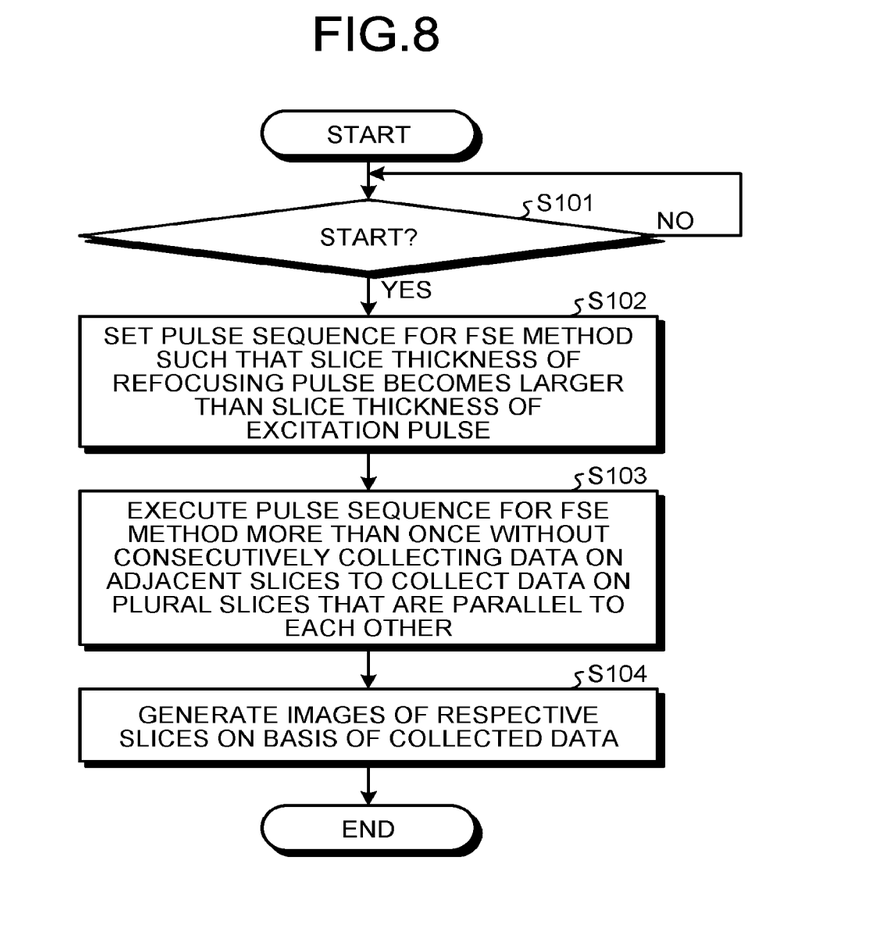
FIG. 8 is a flowchart illustrating a procedure of processing implemented by the MRI apparatus according to the embodiment.

FIG. 8 is a flowchart illustrating a procedure of processing implemented by the MRI apparatus 100 according to the embodiment.

For example, as illustrated in FIG. 8, in this embodiment, in response to a start instruction from an operator (Step S101, Yes), the setting function 17a sets a pulse sequence for an FSE method such that a slice thickness of a refocusing pulse becomes larger than a slice thickness of the excitation pulse (Step S102). This processing at Steps S101 and S102 is implemented by, for example, the processing circuitry 17 reading from the storage 13 and executing a predetermined program corresponding to the setting function 17a.

Thereafter, the collecting function 15a executes the pulse sequence for the FSE method more than once without consecutively collecting data on adjacent slices to collect data on plural slices that are parallel to each other (Step S103). This processing at Step S103 is implemented by, for example, the processing circuitry 15 reading from the storage 13 and executing a predetermined program corresponding to the collecting function 15a.

The generating function 16a then generates images of the respective slices on the basis of the data collected by the collecting function 15a (Step S104). This processing at Step S104 is implemented by, for example, the processing circuitry 16 reading from the storage 13 and executing a predetermined program corresponding to the generating function 16a.

According to the description above, the processing circuitries 14 to 17 are each implemented by a single processor, but the embodiment is not limited to this example. For example, the processing circuitries 14 to 17 may each be formed of a combination of plural independent processors and each of the processing functions may be implemented by these processors executing the program. Furthermore, the processing functions included in the processing circuitries 14 to 17 may be implemented by being distributed to plural pieces of processing circuitry or integrated into a single piece of processing circuitry, as appropriate. In addition, according to the description above, the single storage 13 stores the programs corresponding to the processing functions, but the embodiment is not limited to this example. For example, plural storages may be arranged respectively for the processing circuitries 14 to 17 in a distributed manner and the processing circuitries 14 to 17 may be configured to read the corresponding programs respectively from their individual storages.

As described above, in this embodiment, the setting function 17a sets a pulse sequence for an FSE method to collect plural echo signals by application of a refocusing pulse more than once after application of an excitation pulse once. Furthermore, the collecting function 15a collects data on plural slices parallel to each other, by executing, more than once, the pulse sequence for the FSE method set by the setting function 17a. The setting function 17a sets the pulse sequence for the FSE method such that the slice thickness for the refocusing pulse becomes larger than the slice thickness for the excitation pulse. In addition, the collecting function 15a collects data on the plural slices by executing the pulse sequence for the FSE method without consecutively collecting data on adjacent ones of the plural slices.

This configuration enables decrease in luminance at the CSF in the T1-weighted image and increase in luminance at the CSF in the T2-weighted image, as described above, by the slice thickness for the refocusing pulse being made larger than the slice thickness for the excitation pulse. Furthermore, collecting the data on the slices without consecutively collecting data on adjacent ones of the slices reduces the interference caused between adjacent slices even in a case where the slice thickness of the refocusing pulse is set larger than the slice thickness of the excitation pulse, as described above. Therefore, this embodiment enables improvement of the contrast for the CSF in the images.

In addition, in this embodiment, the setting function 17a sets the slice thickness for the refocusing pulse larger than the slice thickness for the excitation pulse by adjusting the intensity of the gradient magnetic field in the slice direction, the gradient magnetic field being applied together with the refocusing pulse. Characteristics of the refocusing pulse are thereby able to be improved without extension of the echo train space (ETS) or increase of the specific absorption rate (SAR).

Modifications of Embodiment

One embodiment of the MRI apparatus 100 has been described above, but the above described embodiment may be implemented by change of part of the configuration of the MRI apparatus 100 as appropriate. Some modifications according to the embodiment described above will thus be described below. Points different from those of the above described embodiment will be mainly described below and any description common to the embodiment and modifications will be omitted.

For example, the embodiment is not limited to the above described example of the case where the collecting function 15a repeats: dividing plural slices into groups each including every other slice such that adjacent ones of the slices are included in groups different from each other; and then collecting, in order, group by group, data on every other slice selected.

For example, the interval between the slices to be included in each of the plural groups where the plural slices are divided into is not limited to one slice and may be two or more slices. For example, in a case where the imaging division number specified by an operator is "3", the collecting function 15a divides plural slices into three groups each including every third slice and collects data on the slices separately for the three groups.

Furthermore, the interval between the slices for selection of slices group by group is also not limited to one slice and may be two or more slices. For example, the collecting function 15a may collect data on the slices included in the respective groups by repeating, group by group: selecting a slice every three slices in the direction the slices are sequenced; and collecting, in order, data on the selected slices.

In addition, for example, without grouping the slices, the collecting function 15a may repeat collecting, in order, data on slices resulting from selection of a slice every two or more slices from all of plural slices parallel to each other. In this case, for example, the collecting function 15a collects data on the slices by repeating: selecting a slice every two or more slices in the direction the plural slices are sequenced; and collecting, in order, data on the selected slices.

Furthermore, the embodiment is not limited to the above described example of the case where the setting function 17a sets the slice thickness for the refocusing pulse larger than the slice thickness for the excitation pulse by adjusting the intensity of the gradient magnetic field in the slice direction, the gradient magnetic field being applied together with the refocusing pulse.

For example, the setting function 17a may adjust the band of the refocusing pulse and also set the slice thickness for the refocusing pulse larger than the slice thickness for the excitation pulse.

In the case where the intensity of the gradient magnetic field in the slice direction is adjusted and the slice thickness for the refocusing pulse is set, the influence of magnetic field inhomogeneity may be increased if intensities of the gradient magnetic field in the slice direction differ too much between the excitation pulse and the refocusing pulse.

The setting function 17a thus may set the slice thickness for the refocusing pulse larger than the slice thickness for the excitation pulse without changing the ratio between the slice gradient magnetic field for the excitation pulse and the slice gradient magnetic field for the refocusing pulse, by adjusting, according to the level of the magnetic field inhomogeneity at each of positions of the plural slices: the intensity of the gradient magnetic field in the slice direction applied together with the refocusing pulse; and the band of the refocusing pulse, for example. In this case, for example, by using a B0 map captured by preparatory imaging performed before actual imaging, the setting function 17a obtains the magnetic field inhomogeneity at the position of each slice and adjusts the band of the RF pulse according to the level of the magnetic field inhomogeneity. This is because in a case where the magnetic field is homogeneous to some extent and there is no influence of the inhomogeneity, just the change of the slice thickness for the refocusing pulse like in the above described embodiment is considered to be sufficient, although a large increase in the SAR is unavoidable if the band of the refocusing pulse is uniformly widened.

In addition, the embodiment is not limited to the above described example of the case where the setting function 17a sets the slice thickness for the refocusing pulse according to the slice intervals between the plural slices.

For example, the setting function 17a may change the slice thickness for the refocusing pulse according to the imaging conditions (image contrast).

Other Embodiments

The embodiment is not limited to the above described example of the case where the setting unit and the collecting unit in this specification are implemented respectively by the setting function 17a of the processing circuitry 17 and the collecting function 15a of the processing circuitry 15. For example, in addition to being implemented by the setting function 17a and the collecting function 15a described with respect to the embodiment, the same functions of the setting unit and the collecting unit in this specification may be implemented by hardware only, software only, or a combination of hardware and software.

Furthermore, the embodiment is not limited to the above described example where the "processors" read from the storage and execute the programs corresponding to the respective processing functions. The term, "processor", means, for example, a circuit, such as a central processing unit (CPU), a graphics processing unit (GPU), an application specific integrated circuit (ASIC), or a programmable logic device (for example, a simple programmable logic device (SPLD), a complex programmable logic device (CPLD), or a field programmable gate array (FPGA)). In a case where the processors are CPUs, for example, the processors implement the processing functions by reading and executing the programs stored in the storage. In contrast, in a case where the processors are ASICs, instead of the programs being stored in the storage, the processing functions are directly incorporated, as logic circuits, in the circuits of the processors. In addition, each of the processors according to the embodiment is not necessarily configured as a single circuit, and plural independent circuits may be combined together to be configured as a single processor and implement the corresponding processing function. Furthermore, plural components in FIG. 1 may be integrated into a single processor and their processing functions may thereby be implemented.

The programs executed by the processors are provided by being incorporated in, for example, a read only memory (ROM) or the storage beforehand. These programs may be provided by being recorded as files having a format installable or executable in these devices in a computer-readable storage medium, such as a compact disk ROM (CD-ROM), a flexible disk (FD), a CD-recordable (CD-R), or a digital versatile disc (DVD). The programs may also be provided or distributed by being stored on a computer connected to a network, such as the Internet, and being downloaded via the network. For example, these programs may be configured as modules including the above described functional units. As to actual hardware, by the CPUs reading and executing the programs from a storage medium, such as a ROM, the modules are loaded and generated on a main storage.

According to at least one of the above described embodiments, contrast for CSF in images is able to be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising: processing circuitry configured to:
    set a pulse sequence to collect plural echo signals by applying an excitation pulse and consecutively applying a plurality of refocusing pulses subsequently to the excitation pulse; and
    collect data on plural slices that are parallel to each other by executing the pulse sequence more than once, wherein
    the processing circuitry is further configured to:
        set the pulse sequence such that a slice thickness for each of the plurality of refocusing pulses becomes larger than a slice thickness for the excitation pulse; and
        collect the data on the plural slices by executing the pulse sequence without consecutively collecting data on adjacent ones of the plural slices.

2. The magnetic resonance imaging apparatus according to claim 1, wherein the processing circuitry is further configured to divide the plural slices into plural groups such that the adjacent slices are included in groups different from each other and then collect, in order, group by group, data on slices included in each of the plural groups.

3. The magnetic resonance imaging apparatus according to claim 2, wherein the processing circuitry is further configured to collect the data on the slices included in each of the plural groups by repeating, group by group: selecting a slice every two or more slices in a direction the slices are sequenced; and collecting, in order, data on the selected slices.

4. The magnetic resonance imaging apparatus according to claim 1, wherein the processing circuitry is further configured to collect the data on the plural slices by repeating: selecting a slice every two or more slices in a direction the plural slices are sequenced; and collecting, in order, data on the selected slices.

5. The magnetic resonance imaging apparatus according to claim 1, wherein the processing circuitry is further configured to set the slice thickness of each of the plurality of refocusing pulses larger than the slice thickness of the excitation pulse by adjusting intensity of a gradient magnetic field in a slice direction, the gradient magnetic field being applied together with each of the plurality of refocusing pulses.

6. The magnetic resonance imaging apparatus according to claim 1, wherein the processing circuitry is further configured to set the slice thickness of each of the plurality of refocusing pulses larger than the slice thickness of the excitation pulse while adjusting a band of each of the plurality of refocusing pulses.

7. The magnetic resonance imaging apparatus according to claim 1, wherein the processing circuitry is further configured to set the slice thickness of each of the plurality of refocusing pulses larger than the slice thickness of the excitation pulse by adjusting, according to a level of magnetic field inhomogeneity at each of positions of the plural slices: intensity of a gradient magnetic field in a slice direction, the gradient magnetic field being applied together with each of the plurality of refocusing pulses; and a band of each of the refocusing pulses.

8. The magnetic resonance imaging apparatus according to claim 1, wherein the processing circuitry is further configured to change the slice thickness of each of the plurality of refocusing pulses according to an imaging condition.

9. The magnetic resonance imaging apparatus according to claim 1, wherein the processing circuitry is further configured to set the slice thickness of each of the plurality of refocusing pulses according to a slice interval between the plural slices.

10. The magnetic resonance imaging apparatus according to claim 1, wherein the processing circuitry is further configured to set the pulse sequence such that the slice thickness for each of the plural refocusing pulses becomes larger than the slice thickness for the excitation pulse within a range of slice thickness with which magnitude of interference between slices caused by the refocusing pulses stays within a permissible range.

11. The magnetic resonance imaging apparatus according to claim 1, wherein the processing circuitry is further configured to generate an image having a decreased luminance in cerebrospinal fluid in a T1-weighted image and an increased luminance in cerebrospinal fluid in a T2-weighted image.

* * * * *